United States Patent [19]

Okamoto et al.

[11] Patent Number: 4,522,746

[45] Date of Patent: Jun. 11, 1985

[54] ELECTRICALLY CONDUCTIVE POLY($\beta$-DIKETONE) AND PROCESS THEREFOR

[75] Inventors: Yoshiyuki Okamoto, Fort Lee, N.J.; Edward F. Hwang, Brooklyn, N.Y.

[73] Assignee: W. R. Grace & Co., New York, N.Y.

[21] Appl. No.: 579,406

[22] Filed: Feb. 13, 1984

[51] Int. Cl.$^3$ .............................................. H01B 1/00
[52] U.S. Cl. .................... 252/500; 252/518; 524/80; 524/401
[58] Field of Search ............... 252/500, 518; 525/355, 525/371, 328.6; 524/80, 401; 526/238, 237

[56] References Cited

U.S. PATENT DOCUMENTS 3,280,075 10/1966 Naarman et al. ................. 525/328.6
4,222,903 9/1980 Heeger et al. ...................... 252/518
4,452,725 6/1984 Wellinghoff et al. ............... 252/500

OTHER PUBLICATIONS

R. Oda, S. Munemiya and M. Okano, MaKromol Chem. 43, 149–151, (1961).

*Primary Examiner*—Josephine L. Barr
*Attorney, Agent, or Firm*—Richard P. Plunkett; William W. McDowell, Jr.

[57] ABSTRACT

This invention relates to an electrically conductive p-doped poly($\beta$-diketone) and a process for forming same utilizing $WCl_6$ as the polymerization catalyst. Doping of the resulting polymer with iodine dopant in either solution or the vapor phase or with tetracyanoquinodimethane (TCNQ) or $AsF_5$ results in a conductive polymer having good stability in air.

6 Claims, No Drawings

ELECTRICALLY CONDUCTIVE POLY(β-DIKETONE) AND PROCESS THEREFOR

BACKGROUND OF THE INVENTION

1. Field of the Invention

This invention relates to a process for forming an electrically conductive material. More particularly, this invention relates to electrically conductive poly(β-diketone).

2. Description of the Prior Art

Doped polymers such as polyacetylene are known in the art. That is, semi-conducting acetylene polymers such as polyacetylene can be chemically doped in a controlled manner with electron acceptor and/or electron donor dopants to produce p-type and n-type electrically conducting doped acetylene polymers. Such doping procedures and the resultant doped acetylene polymers are described in U.S. Pat. No. 4,222,903 and U.S. Pat. No. 4,204,216. Further, a reversible electrochemical method for modifying the electrically conductive properties of an organic polymer, which is dopable with an anionic dopant to a more highly electrically conductive state, which polymer can be used in secondary batteries is taught in U.S. Pat. No. 4,321,114. U.S. Pat. No. 4,228,060 describes the preparation of polyacetylenes useful as electrical conductors when doped. However, the problem with the prior art doped acetylene polymers is that they are environmentally unstable. That is, they are subject to oxidative degradation and instability in the presence of air, moisture and certain common chemicals. This results in loss of conductivity.

It is also known to produce poly(β-diketone) from either ketene or diketene with a $BF_3$ catalyst. See R. Oda, S. Munemiya and M. Okano, Makromol Chem. 43, 149–151 (1961).

OBJECTS OF THE INVENTION

One object of the invention is to prepare a poly(β-diketone) using a novel catalyst system. Another object of the invention is to prepare an electrically conductive p-doped poly(β-diketone). Still another object of the invention in accord with the proceeding object is to prepare a doped poly(beta-diketone) having good stability in air. Other objects will become apparent from a reading hereinafter.

DESCRIPTION OF THE INVENTION

This invention relates to a process for producing poly(β-diketone) which comprises reacting diketene in an inert atmosphere in the presence of a catalyst selected from the group consisting of $BF_3O(C_2H_5)_2$ and $WCl_6$ at temperatures ranging from about minus 20° C. up to plus 30° C. for periods ranging from 16 to 24 hours. The polymerization is carried out in the presence of a solvent such as chlorobenzene, methylene chloride and the like. The catalyst is present in an amount ranging from 0.2 to 2.5% by weight of the diketene. The resultant poly(β-diketone) can be doped to impart electrical conductivity by conventional methods using TCNQ, $AsF_5$ and $I_2$.

A wide variety of doping materials may suitably be employed in doping the poly(β-diketone) to effectively modify its room temperature electrical conductivity. Since the conductivity of the starting poly(β-diketones) will be relatively low to begin with, i.e., on the order of about $10^{-9}$ to $10^{-12}$ ohm$^{-1}$cm$^{-1}$, the required modification for most practical applications will be to effect an increase in conductivity. Dopants suitable for effecting an increase in the room temperature p-type electrical conductivity of the poly(β-diketone) starting material are electron acceptor dopants, including, for example, $Br_2$, $I_2$, $ICl$, $IBr$, $AsF_5$, $Cl_2$, $HBr$, $BF_3$, $BCl_3$, $SO_2$, $SO_3$, $SO_2Cl_2$, $POF_3$, $NO_2$, $HCN$, $ICN$, $O_2$, $SiF_4$, $NO$, tetracyanoquinodimethane (TCNQ) and transition metal carbonyl, phosphine and olefin derivatives. Each of these electron acceptor dopants will effect an increase, to varying degrees, in the room temperature p-type electrical conductivity of the poly(β-diketone) starting material.

The extent to which any given electron acceptor dopant will increase the conductivity of the poly(β-diketone) will depend upon the degree of doping up to a certain point at which the maximum conductivity is obtained for that dopant. Such maximum conductivity will generally be obtained at a degree of doping not greater than about 0.50 mole of electron acceptor dopant per mole of monomer unit. The highest room temperature p-type electrical conductivity thus far achieved in accordance with the present invention, i.e., $10^{-3}$ ohm$^{-1}$cm$^{-1}$, was obtained with $I_2$ or with TCNQ doped poly(β-diketone) containing about 0.2–0.5 mole of $I_2$ or TCNQ per mole of monomer unit.

In carrying out the method of the present invention for producing a p-type doped poly(β-diketone), the polymer powder is contacted with a conductivity modifying dopant, which may be either in the vapor phase or in solution, whereby uptake of the dopant molecules into the poly(β-diketone) molecules occurs to a degree proportional to the dopant concentration and the contacting period. The contacting period is controlled so that the corresponding degree of doping will be such as to provide the resulting doped poly(β-diketone) with p-type electrical conductivity. For example, with the preferred electron acceptor dopants in accordance with the present invention, e.g., iodine, the starting poly(β-diketone) may be contacted in vacuum with the vapor of the electron acceptor dopant for a contacting period ranging from a few seconds to about 24 hours to provide a degree of doping within the range of 0.20 to 0.50 moles of electron acceptor dopant per mole of monomer unit and thereby provide the doped poly(β-diketone) with room temperature p-type electrical conductivity within the range of from about $10^{-6}$ to $10^{-3}$ ohm$^{-1}$cm$^{-1}$.

A preferred doping procedure is to fill a vessel with particles of the poly(β-diketone) to be doped. The vessel is then evacuated, and the vapor of the dopant it then allowed to enter the vessel.

The doping procedure may also be carried out by placing the starting poly(β-diketone) powder in a solution of the dopant (i.e., TCNQ, iodine) in an appropriate organic solvent inert to the poly(β-diketone), such as, for example, benzene, cyclohexane tetrahydrofuran or the like. By trial and error, it is found what length of time is necessary to leave the poly(β-diketone) in the solution to obtain the desired degree of doping. At the completion of the doping period, the doped polymers are removed from the doping solution and rinsed in an additional amount of the organic solvent to remove any residual doping solution therefrom, and the excess solvent is then pumped off in a high vacuum.

The following examples will aid in explaining, but expressly not limit, the instant invention. Unless otherwise noted, all parts and percentages are by weight.

The electrical conductivities of the polymer and the charge transfer complexes with tetracyanoquinodimethane (TCNQ) and $I_2$ were measured on compressed pellets using nickel electrodes with a Keithly electrometer.

EXAMPLE 1

$BF_3O(C_2H_5)_2$ (2 ml) in 50 ml of $CH_2Cl_3$ was added dropwise to a solution containing 50 ml of purified, commercially available diketene in 250 ml $CH_2Cl_2$ with constant stirring under nitrogen atmosphere. The temperature was maintained at $-10°$ to $0°$ C. for half an hour and then the mixture was stirred overnight at room temperature. The original pale yellow solution changed to a dark brown color. The solution was neutralized with 10% aqueous $Na_2CO_3$ solution and then the $CH_2Cl_2$ layer was separated and dried over anhydrous $MgSO_4$. After removal of the solvent and unreacted diketene under reduced pressure, the brown solid obtained was purified repeatedly from acetone solution by adding $CCl_4$. A brown powder was obtained in 10% yield, m.p. $>360°$ C., IR absorption at 1,715, 1,660 and 1,610 cm$^{-1}$. The conductivity of the polymer was in the range of $10^{-12}$ ohm$^{-1}$cm$^{-1}$. The polymer was found to be stable in air and the properties did not change in dry air over a week.

EXAMPLE 2

$BF_3O(C_2H_5)_2$ (1 ml) in 25 ml $CH_3CN$ was used as a catalyst solution for the polymerization of diketene (50 ml) in 250 ml $CH_3CN$. The reaction conditions and treatment were the same as in Example 1. The yield was also 10%, m.p. $>360°$ C. IR absorptions of the product were the same as for the compound obtained in Example 1. The polymer was found to be stable in air and the properties did not change in dry air over a week.

EXAMPLE 3

The polymerization of diketene (40 g) was carried out with tungsten chloride ($WCl_6$); 0.5 g $WCl_6$ in 10 ml benzene at room temperature. The reaction mixture was stirred under a nitrogen atmosphere for several hours. The polymer (2 g) obtained was a light brown color and the IR spectra showed that the polymer has the same structure obtained in Examples 1 and 2. The polymer was found to be stable in air and the properties did not change in dry air over a week.

EXAMPLE 4

Charge transfer complexes of poly($\beta$-diketone) with TCNQ were prepared by stirring a mixture of a weighed amount of the polymer and TCNQ compound in tetrahydrofuran at room temperature for several hours. The complex obtained was filtered, washed with methanol and dried under reduced pressure. The conductivity of the complex (0.2:1 mole ratio of TCNQ to ketene unit) was in the range of $10^{3 \ 14}$ ohm$^{-1}$cm$^{-1}$. The doped polymer was found to be stable in air and the properties did not change over one week in dry air.

EXAMPLE 5

Poly($\beta$-diketone) was treated with various amounts of iodine depending upon the doping process.

(a) Vapor p-doping

A weighed amount of poly($\beta$-diketone) powder was subjected to a chamber saturated with iodine vapor at room temperature. The conductivity and weight gain were measured at different time intervals. Iodine content was also analyzed by elemental analysis. The conductivity of the complex (0.3:1 mole ratio of $I_2$ to ketene unit) was in the range of $10^{-3}$ ohm$^{-1}$to cm$^{-1}$. The doped polymer was found to be stable in air and the properties did not change over one week in dry air.

(b) Solution p-doping

A weighed amount of poly($\beta$-diketone) polymer and a weighed amount of iodine were dissolved in a minimum amount of solvents such as $CH_2Cl_2$, THF and dioxane. The excess amount of iodine and solvent were removed under reduced pressure. The iodine content was determined by elemental analysis. The conductivity of the complex (0.3:1 mole ratio of $I_2$ to ketene unit) was in the range of $10^{-3}$ ohm$^{-1}$cm$^{-1}$. The doped polymer was found to be stable in air and the properties did not change over one week in dry air.

EXAMPLE 6

A weighed amount of poly($\beta$-diketone) was subjected to a chamber saturated with $AsF_5$ vapor. The conductivity and weight gain of the complex were measured at different time intervals. The conductivity of the complex (0.2:1 mole ratio of $AsF_5$ to ketene) was in the range of $10^{-5}$ ohm$^{-1}$cm$^{-1}$. $AsF_5$ content was determined by elemental analysis. The doped polymer was found to be stable in air, and the properties did not change over one week in dry air.

We claim:

1. The process of forming an electrically conductive poly($\beta$-diketone) having a conductivity of at least $10^5$ohm$^{-1}$cm$^{-1}$ which comprises doping at room temperature said poly($\beta$-diketone) with 0.2–0.5 moles of an electron acceptor dopant per molecule of diketene monomer unit in the poly($\beta$-diketone), said dopant being present in the vapor phase or in solution in an organic solvent.

2. The process according to claim 1 wherein the electron acceptor dopant is iodine.

3. The process according to claim 2 wherein the iodine is in solution in an organic solvent.

4. The process according to claim 2 wherein the iodine is in the vapor phase.

5. The process according to claim 1 wherein the electron acceptor dopant is tetracyanoquinodimethane.

6. The process according to claim 1 wherein the electron acceptor dopant is $AsF_5$.

* * * * *